United States Patent
Kunnathu Kulangara et al.

(10) Patent No.: US 10,715,644 B2
(45) Date of Patent: Jul. 14, 2020

(54) COMMON ACOUSTIC TRANSDUCER AND INDICATOR LAMP PORT FOR ELECTRONIC DEVICES

(71) Applicant: Intel Corporation, Santa Clara, CA (US)

(72) Inventors: Ajesh Kunnathu Kulangara, Bangalore (IN); Devanathan Kannan, Bangalore (IN)

(73) Assignee: Intel Corporation, Santa Clara, CA (US)

( * ) Notice: Subject to any disclaimer, the term of this patent is extended or adjusted under 35 U.S.C. 154(b) by 196 days.

(21) Appl. No.: 15/614,831

(22) Filed: Jun. 6, 2017

(65) Prior Publication Data
US 2018/0352062 A1    Dec. 6, 2018

(51) Int. Cl.
| | |
|---|---|
| H04R 25/00 | (2006.01) |
| H04M 1/03 | (2006.01) |
| H01L 23/04 | (2006.01) |
| H04R 1/02 | (2006.01) |
| H04M 1/22 | (2006.01) |

(52) U.S. Cl.
CPC ............ H04M 1/035 (2013.01); H01L 23/04 (2013.01); H04M 1/03 (2013.01); H04M 1/22 (2013.01); H04R 1/028 (2013.01); *H04R 2499/11* (2013.01); *H04R 2499/15* (2013.01)

(58) Field of Classification Search
CPC ....... H04M 1/035; H04R 1/026; H04R 19/04; H01L 23/04

USPC ................ 381/342; 385/147; 455/575.1
See application file for complete search history.

(56) References Cited

U.S. PATENT DOCUMENTS

| | | | | |
|---|---|---|---|---|
| 6,006,118 | A * | 12/1999 | Stephenson | H01H 13/702 362/23.03 |
| 7,062,059 | B1 * | 6/2006 | Bobisuthi | H04M 1/05 381/370 |
| 7,306,347 | B2 * | 12/2007 | Selover | F21V 33/0052 362/806 |
| 9,608,389 | B2 * | 3/2017 | Chen | H01R 13/66 |
| 9,795,044 | B2 * | 10/2017 | Lai | H04R 1/02 |
| 9,800,962 | B2 * | 10/2017 | Lai | G06F 1/1688 |
| 9,843,851 | B2 * | 12/2017 | Chamberlin | H04R 1/028 |
| 10,028,045 | B1 * | 7/2018 | Saini | H04M 1/22 |
| 10,425,712 | B1 * | 9/2019 | Chamberlin | H04R 1/342 |
| 2003/0048912 | A1 * | 3/2003 | Reich | H04R 1/02 381/124 |
| 2005/0196127 | A1 * | 9/2005 | Cole | H04M 1/035 385/147 |

(Continued)

FOREIGN PATENT DOCUMENTS

| | | | | |
|---|---|---|---|---|
| EP | | 1037445 A2 * | 9/2000 | ....... H04M 1/0202 |
| EP | | 1041798 A1 * | 10/2000 | ....... H04M 1/03 |
| JP | | 11084533 A * | 3/1999 | |

*Primary Examiner* — Phylesha Dabney
(74) *Attorney, Agent, or Firm* — Finch & Maloney PLLC

(57) ABSTRACT

A port for an electronic device is described that is common to an acoustic transducer and an indicator lamp. On example pertains to an apparatus that includes an external housing, an acoustic port through a surface of the external housing, an acoustic transducer, a tube between the port and the acoustic transducer having a channel to conduct audio from the port to the acoustic transducer, and a lamp to illuminate the channel so that the channel conducts light out the port.

18 Claims, 5 Drawing Sheets

(56) References Cited

U.S. PATENT DOCUMENTS

2015/0022620 A1\* 1/2015 Siminoff .............. H04M 11/025
 348/14.02
2017/0367201 A1\* 12/2017 Wright ..................... H04R 1/02
2018/0245787 A1\* 8/2018 Zhuang ................... F21V 29/70

\* cited by examiner

US 10,715,644 B2

COMMON ACOUSTIC TRANSDUCER AND INDICATOR LAMP PORT FOR ELECTRONIC DEVICES

FIELD

The present description relates to compact electronic devices and in particular to indicator lamps for such devices.

BACKGROUND

Small electronic devices continue to strive for attractive simplistic designs that blend well with household, and office decor. At the same time, functional needs continue to add ever more openings and holes. In devices such as phones, tablets, 2-in-1 computers, notebook computers, home automation hubs, televisions, and other voice or visual interface devices, there are multiple openings or holes in the industrial design to accommodate microphone inputs, speakers, indication lamps, fans, connector ports, control interfaces, cameras, proximity sensors, illuminators, etc. With newer spatial technologies, the number of holes and ports is increasing. Some devices may have four microphone holes. Some have monaural and stereo speaker holes for close and far listening. Some have arrays of cameras on multiple sides and with different characteristics and different illuminators, such as infrared and visible light.

All of these many ports and holes make it more difficult to produce a unique and attractive system design. Traditionally these holes were hidden behind grills or perforated surfaces that were integrated into the overall appearance. Some holes and ports are placed at seams or next to a button or other part to make the port less noticeable. In some cases some of the ports and holes are placed on a back side of the device. Many of the connections have been made wireless in an effort to eliminate holes for electrical data and power connections. These techniques must be balanced against the required function of the hole or port so that audio, video or other functions are not hindered. There are also efforts to hide indicator lights or blend them into the design.

BRIEF DESCRIPTION OF THE DRAWINGS

Embodiments are illustrated by way of example, and not by way of limitation, in the figures of the accompanying drawings in which like reference numerals refer to similar elements.

DETAILED DESCRIPTION

As described herein a microphone input port and light indicator can be combined to reduce the complexity of a system surface. The indicator lamp also reduces the perception of there being a microphone port because the user is aware instead of the indicator function. This causes the perception of there being fewer ports or holes in the industrial design. In some embodiments, a transparent material, such as glass or a plastic is used for the audio channel through the device to the microphone. This channel guides sound from the small external hole to a larger microphone within the device. Being transparent, it may also be illuminated and used to guide light from a lamp, such as an LED located in the system housing to the hole on the exterior surface of the housing.

By using a common port for a microphone input and an indicator lamp, the number of holes in the exterior design appears to be reduced. This will improve the look and feel of the device since the number of ports or holes in the design is minimized.

Figure 1:
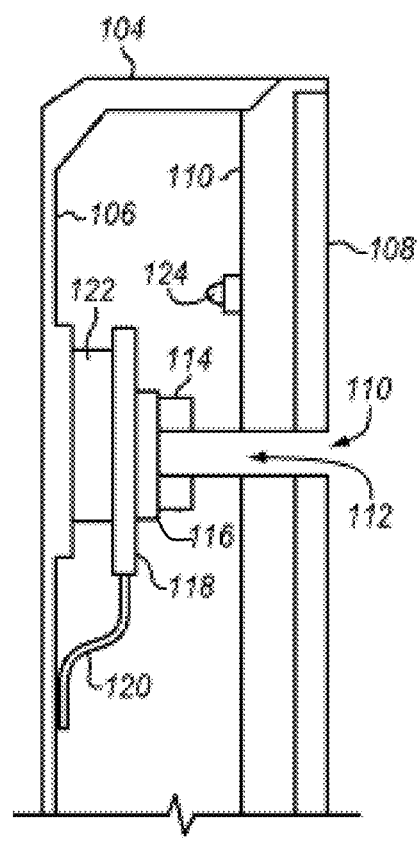
FIG. 1 is a cross-sectional side view diagram of a microphone with an illuminated channel integrated inside a device housing according to an embodiment.

FIG. 1 is a cross-sectional diagram of an example of a microphone-equipped device, in this case a smartphone, tablet, or similar device. The device has a back cover 104 and a front screen 108. The screen has a backing 110 that may include a touchscreen controller or other components. Alternatively, this portion of the device may be in the bezel or other part of the housing and not under a glass or plastic display. There is a port or opening 110 in the display or housing that leads to a channel 112. The channel in this example is a straight tube that leads to a microphone 116. The microphone is attached to a printed circuit board 118 or other mounting surface with cabling 120 to connect to the rest of the device. While a microphone is shown any other suitable acoustic transducer may be used.

The tube that forms the channel may be curved or bent in any of a variety of ways to conduct sound to the microphone. There may be additional acoustic features such as filters, screens, or baffles in the channel in order to modify the sound coming through the port. In some cases, the port may be smaller than the tube, as shown, and may include a screen or cover to prevent impurities from coming to the microphone.

The microphone in this example is mounted to the back cover of the device through a sponge or gasket 122 that is attached to the back cover. The microphone 116 mount 118 is then attached to the gasket 122. In this example, there is a protrusion from the back cover to precisely position the gasket but the microphone may be mounted in any of a variety of different ways to suit the overall form and function of the device. A second gasket 114 is mounted around the microphone and the tube of the channel 112 is attached to this gasket. The gaskets help to avoid microphone leakage by sealing the channel and provide resiliency for the device. In some cases the tube is made from a resilient or elastomeric material so that the back cover, glass front and other components are able to move and bend from external pressure without breaking the tube or forcing the tube to break other surrounding components.

In some cases, microphone porting is an important aspect of system design. Aesthetic and mechanical design are combined to ensure that the microphone device opening is channeled to microphone hole and that proper sealing is ensured. Without proper sealing some certifications, such as 3GPP, CORTANA, etc. may be denied. In some embodiments, air-tight rubber gaskets ensure proper sealing for the microphones.

In addition to the microphone a lamp 124, such as an LED (Light Emitting Diode), may be added to the system. The lamp may be mounted to the same board as the microphone or to any other appropriate portion of the device. In FIG. 1, the lamp is attached to the touchscreen controller board. A transparent material, e.g. glass or plastic, such as a clear acrylic, is used for the microphone channel 112 so that it the microphone channel guides the light for LED from inside the device to the port 110. The tube now acts as a light guide for the lamp and also as an acoustic microphone channel. The placement of the lamp may be adjusted to obtain a desired level of illumination at the port. A brighter lamp may be placed farther from the port or the light may be attenuated before entering the channel. For a dimmer lamp there may be careful placement of the lamp or even a light guide to conduct light into the channel. The light beams will not affect the acoustic properties of the channel. The input waves to the microphones will not be affected when the port is acting as light guide.

Figure 2:
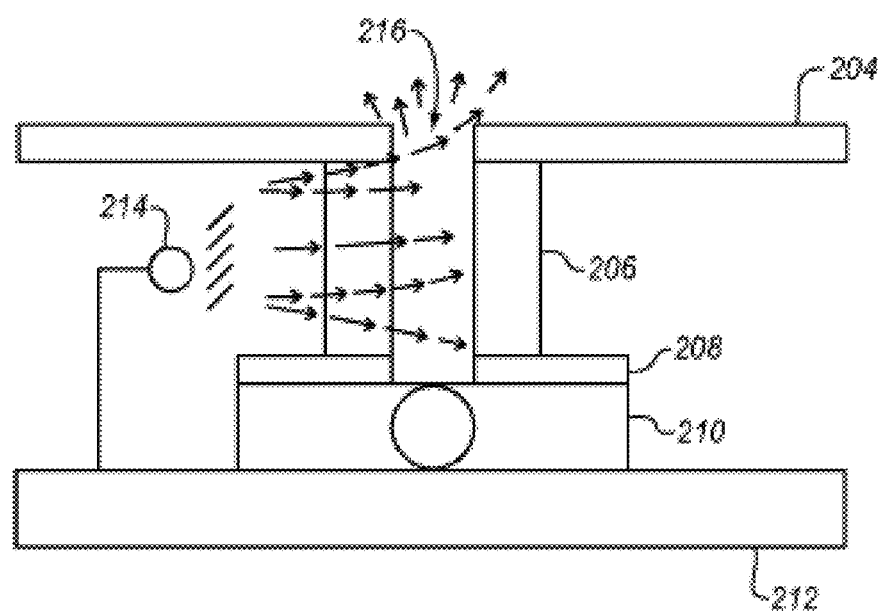
FIG. 2 is an alternative cross-sectional side view diagram of a microphone with an illuminated channel integrated inside a device housing according to an embodiment.

FIG. 2 is a cross-sectional side view diagram showing many of the same components to highlight key features. The device has an exterior 204 for housing with an opening or port 216. The port opens to a channel 206 formed from a transparent tube. The tube is straight and cylindrical in this example, but may be any other shape or configuration. The channel leads to a top ported microphone 210 which is mounted to a printed circuit board 212. There is a rubber gasket 208 between the channel and the microphone. This allows for the use of a rigid channel. Alternatively, the tube that forms the channel may be made from a resilient material.

A lamp, in this case an LED 214 is also coupled to the circuit board 212 and positioned above the microphone near the tube. The LED is activated based on cues from software, an operating system, or a power supply system and, when activated, illuminates the tube. The LED is optically coupled to the tube so that the light from the LED penetrates into the channel, is reflected from surfaces in the channel and at least a portion of the light emerges from the port 216 where it can be seen by a user. The position of the LED, the nature of the tube and the reflective nature of the surfaces around the tube determine the degree of coupling and, accordingly, how much of the light penetrates out through the tube.

Figure 3:
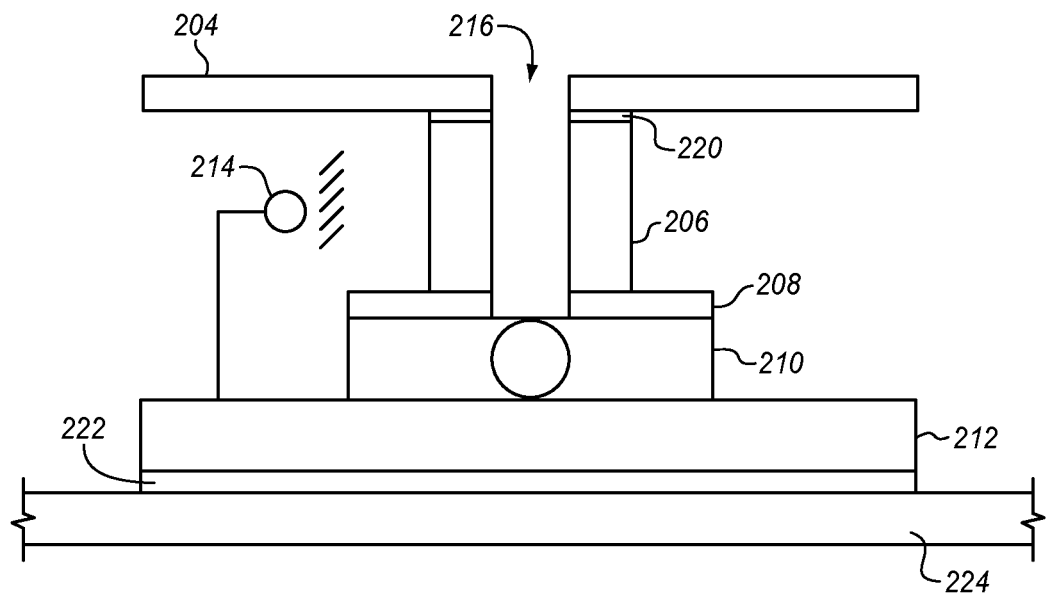
FIG. 3 is a cross-sectional side view diagram of a microphone with an illuminated channel integrated inside a device housing with additional gasketing according to an embodiment.

FIG. 3 is a cross-sectional side view diagram of an alternative illuminated microphone channel. In this case, the channel has been augmented with additional gaskets. In addition to the gasket 208 between the tube 206 and the microphone 210, there is a gasket 220 between the tube 206 and the exterior housing material 204. This adds additional resiliency against compressive and bending forces between the housing and the circuit board. A third gasket 222 is placed beneath circuit board 212 between the circuit board and the circuit board mounting surface 224. In the example of FIG. 1, this mounting surface is the back of the housing but it may be any other mounting surface. This additional gasket provides another area of resiliency. The system may be configured with one, two, or all three of these gaskets, or with additional or different gaskets, depending on the implementation.

The gaskets ensure good efficiency for the light guide to produce the LED indication. Opaque, rubber materials may be to seal the microphones because of their flexibility properties. The rubber gaskets may be configured to provide enough overlap to ensure sealing in the final system assembly. This allows that if the channel compresses the flexible rubber gasket below, a good seal is still ensured. The rubber gasket 220 may also be added above the porting channel 206 as well for a good and tight assembly stack up. However this will not impact the amount of light coming out thru the microphone hole. On the contrary, it helps to prevent stray light from leaking out of different holes in the system.

Figure 4:
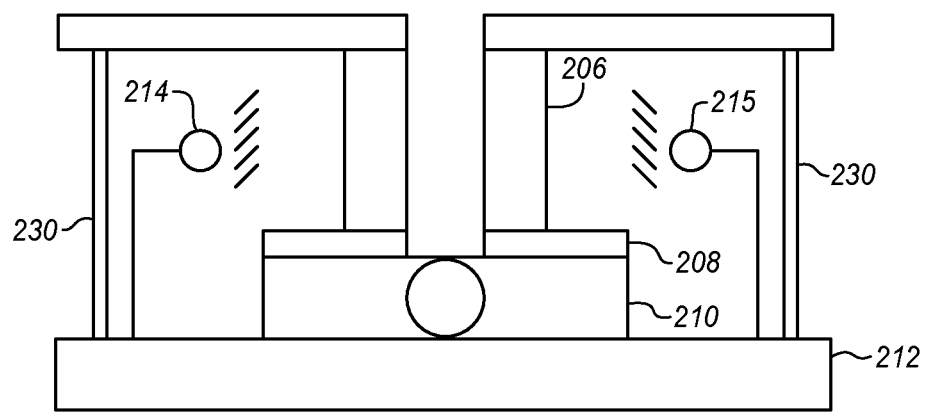
FIG. 4 is a cross-sectional side view diagram of a microphone with an illuminated channel integrated inside a device housing with an additional lamp and reflectors according to an embodiment.

Since the lamp illuminates the channel indirectly, it may not be suitable for high intensity application such as photography or video flash. On the other hand it is well suited to many other indications and warnings, such as battery charging and status, power or ON/OFF status, device standby state indication, a breathing LED to show that the system is ON, and many other status indications, FIG. 4 is a cross-sectional side view diagram of an alternative illuminated microphone channel having a second lamp 215. There may be two or more lamps near the tube 206. These may be used to increase the brightness of the illumination provided to the channel or different colors may be used. In a simple example a red LED may be used for one lamp 214 and a green LED may be used as the other lamp 215. Both lamps are coupled to a controller, such as one on the circuit board 212. This allows a red or a green status to be indicated to the user. Additional colors may be added, such as amber or blue to other states. As a further alternative, the colors of several different lamps may be combined in different brightnesses. For example, with a red, green, and blue LED most any visible color may be created by varying the brightness of the three LEDs. This increases the different possible status indications. Whether there are one, two, three, or more lamps, they may all be controlled by a controller in the device to manage state and illumination intensity.

The device also includes reflectors 230 partially or completely surrounding the lamps 214, 215 and the tube 206. In this cross-sectional diagram, as mentioned above, the channel is typically cylindrical, although other shapes may be used. In the cross-section, only portion of the walls on opposite sides are visible. The reflector may also be cylindrical to surround the tube. The reflector reflects light from each lamp back toward the tube increasing the amount of the light that enters the tube and reducing stray light in the system. It is not necessary that the reflector surround the entire tube, nor that it extend for the whole height of the tube. The configuration and size of the reflector may be adapted to suit different implementations.

Figure 5:
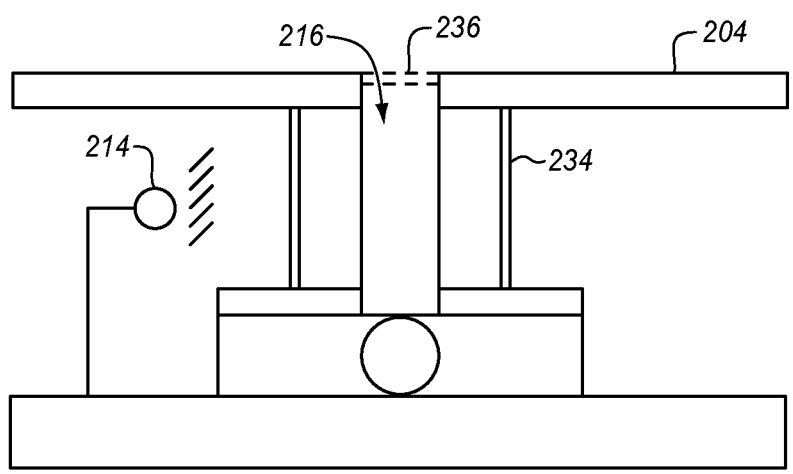
FIG. 5 is a cross-sectional side view diagram of a microphone with an illuminated channel integrated inside a device housing with diffusers according to an embodiment.

FIG. 5 is a cross-sectional side view diagram of another alternative illuminated microphone channel having diffusers. In this example, there is a diffuser 234 fully or partially surrounding the channel. The diffuser diffuses the light entering the channel so that it is more evenly spread through the channel and less direct on the user's eyes. The diffuser may be a texture applied to the tube by stamping, grinding, rolling or another process. The diffuser may alternatively be a coating or a wrapping material. A second diffuser 236 is applied at the port 216. This diffuser may be a screen or filter over the microphone port or within the channel. If the diffuser is a screen, it may also serve to protect the microphone and improve the acoustic characteristics of the audio that makes it to the microphone. Screens may be made of gratings, perforated metals, fabrics and other materials.

While the channel is shown as connecting a microphone to a port, other types of channels and ports may be illuminated. In some implementations the acoustic transducer is a speaker mounted within a device with a channel to an external port. The same illumination approach as described herein for a microphone channel may be used for a speaker channel. Similarly ventilation, cooling, and other ports may be illuminated using similar techniques. While the additional gaskets, lamps, reflectors and diffusers are only shown in respective figures, these features may be added to any one or more of the other embodiments, depending on the intended use and application.

Figure 6:
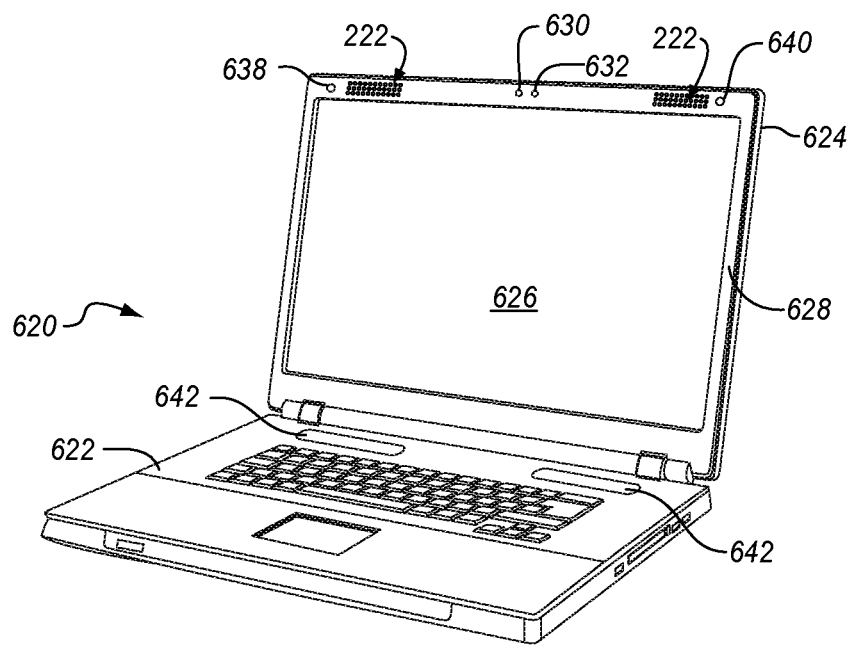
FIG. 6 is an isometric diagram of a portable device with microphone cavity and surface mesh according to an embodiment

FIG. 6 is an isometric diagram of a portable device suitable for use with the microphone channel and indicator lamp as described herein. This device is a notebook, convertible, or tablet computer 620 with attached keyboard. The device has a display section 624 with a display 626 and a bezel 628 surrounding the display. The display section is attached to a base 622 with a keyboard and speakers 642. The bezel is used as a location to mount a camera 630 and a white flash or lamp 632. The bezel is also used to house one or more microphone ports 638, 640 with channels and lamps. In this example the microphones are separated apart to provide a spatial character to the received audio. Each port may be coupled to one or more indicator lamps and more or fewer microphone ports may be used depending on the desired cost and audio performance. The ISP, graphics processor, CPU and other components are typically housed in the base 622 but may be housed in the display section, depending on the particular implementation.

Figure 7:
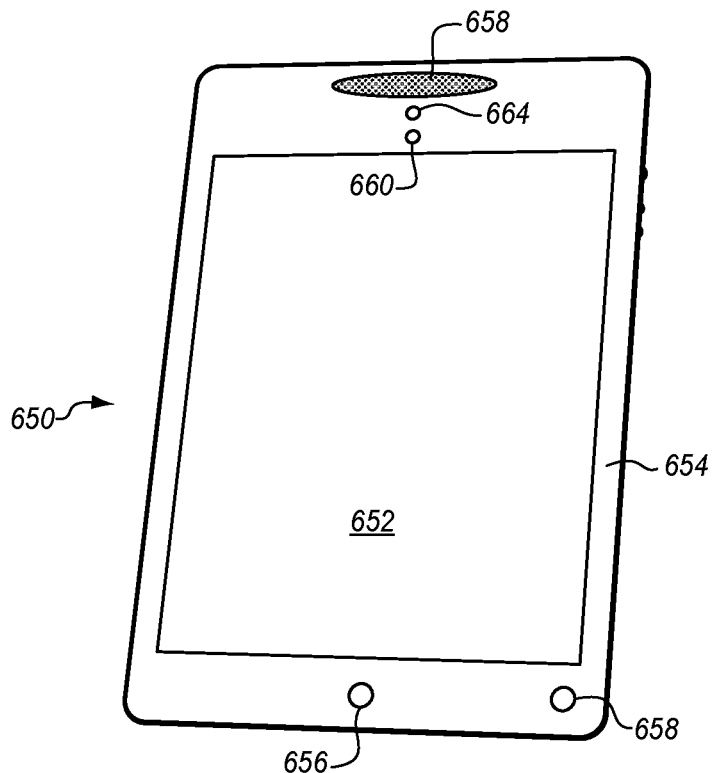
FIG. 7 is an isometric diagram of a tablet or phone with a microphone cavity and surface mesh according to an embodiment

FIG. 7 shows a similar device as a portable tablet or smart phone. A similar approach may be used for a desktop monitor, wall display, or television. The tablet or monitor 650 includes a display 652 and a bezel 654. The bezel is used to house the various audiovisual components of the device. In this example, the bottom part of the bezel below the display houses two microphone ports 656, 658 each with corresponding channels and indicator lamps as described above. The top of the bezel above the display houses a speaker 658. This is a suitable configuration for a smart phone and may also be adapted for use with other types of devices. The bezel also houses a camera 660 and a white LED 664. The various processors and other components discussed above may be housed behind the display and bezel or in another connected component. While the microphone ports are shown as being in bezels, they may alternatively be covered by the glass of the display, either as glass cover or with a port through a part of the display.

The particular placement and number of the components shown may be adapted to suit different usage models. More and fewer microphones, speakers, and LEDs may be used to suit different implementations. Additional components, such as proximity sensors, rangefinders, additional cameras, and other components may also be added to the bezel or to other locations, depending on the particular implementation.

The portable devices of FIGS. 6 and 7 are provided as examples but different form factors such as a helmet, sports goggles, a headset, a desktop workstation, a wall display, a conference telephone, an all-in-one or convertible computer, and a set-top box form factor may be used, among others. In some implementations, the display may not have a bezel. For such a display, the microphones, cameras, speakers, LEDs and other components may be mounted in other housings that may or may not be attached to the display. In other implementations, the device may not have a display and the indicator lamps act as a part of the user interface.

In another embodiment, the microphones are mounted to a separate housing possibly also with cameras and speakers to provide a remote communications device that receives sound in different environments in a compact enclosure. A separate communications interface may then transmit the received audio and images, if any to another location for recording and viewing.

Figure 8:
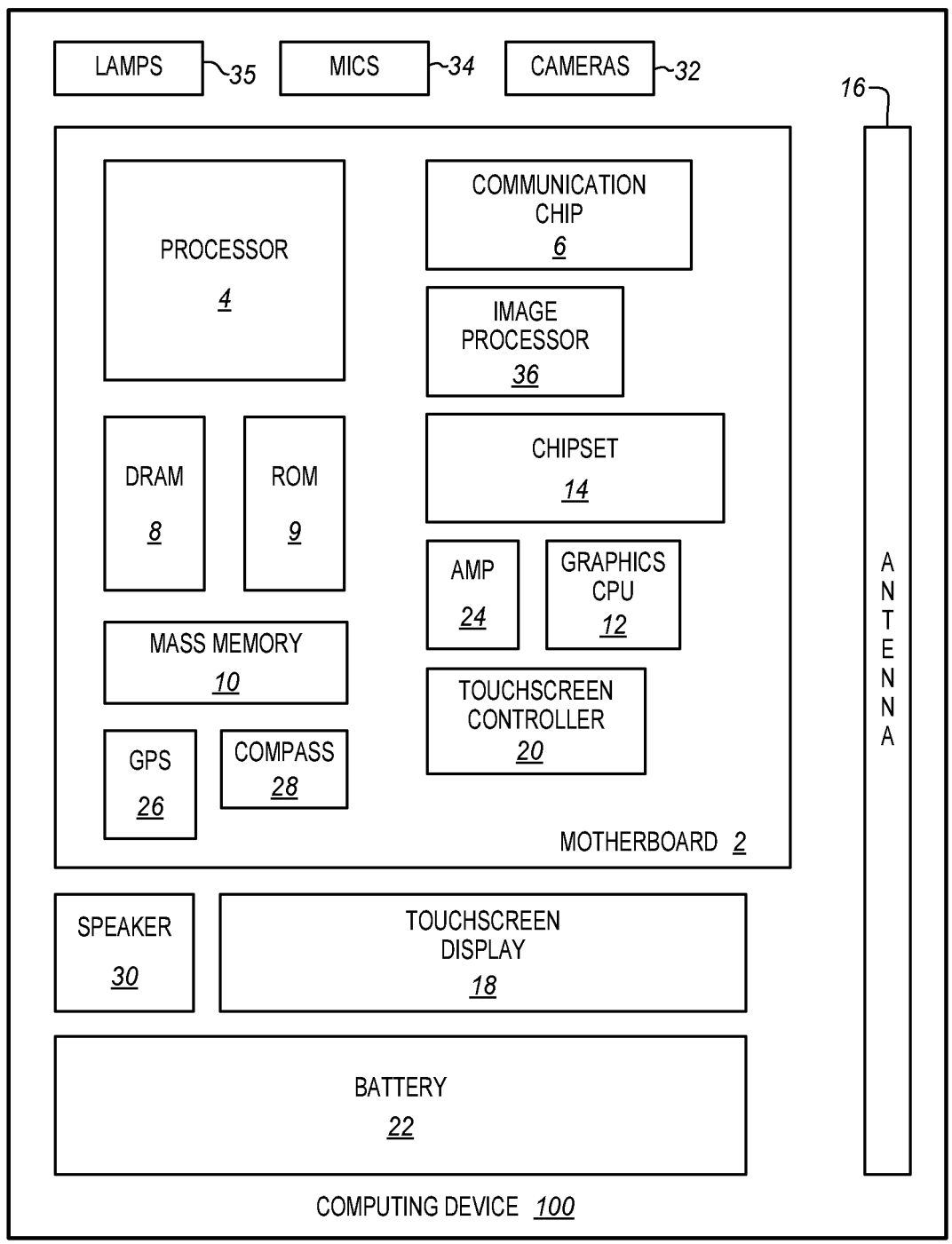
FIG. 8 is a block diagram of a computing device incorporating a microphone cavity and surface mesh according to an embodiment.

FIG. 8 is a block diagram of a computing device 100 in accordance with one implementation. The computing device 100 houses a system board 2. The board 2 may include a number of components, including but not limited to a processor 4 and at least one communication package 6. The communication package is coupled to one or more antennas 16. The processor 4 is physically and electrically coupled to the board 2.

Depending on its applications, computing device 100 may include other components that may or may not be physically and electrically coupled to the board 2. These other components include, but are not limited to, volatile memory (e.g., DRAM) 8, non-volatile memory (e.g., ROM) 9, flash memory (not shown), a graphics processor 12, a digital signal processor (not shown), a crypto processor (not shown), a chipset 14, an antenna 16, a display 18 such as a touchscreen display, a touchscreen controller 20, a battery 22, an audio codec (not shown), a video codec (not shown), a power amplifier 24, a global positioning system (GPS) device 26, a compass 28, an accelerometer (not shown), a gyroscope (not shown), a speaker 30, cameras 32, a microphone array 34, and a mass storage device (such as hard disk drive) 10, compact disk (CD) (not shown), digital versatile disk (DVD) (not shown), and so forth). These components may be connected to the system board 2, mounted to the system board, or combined with any of the other components.

The communication package 6 enables wireless and/or wired communications for the transfer of data to and from the computing device 100. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication package 6 may implement any of a number of wireless or wired standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, Ethernet derivatives thereof, as well as any other wireless and wired protocols that are designated as 3G, 4G, 5G, and beyond. The computing device 100 may include a plurality of communication packages 6. For instance, a first communication package 6 may be dedicated to shorter range wireless communications such as Wi-Fi and Bluetooth and a second communication package 6 may be dedicated to longer range wireless communications such as GPS, EDGE, GPRS, CDMA, WiMAX, LTE, Ev-DO, and others.

The microphones 34 may be mounted behind illuminated channels as described herein and coupled to audio processing resources of the processor or another dedicated processing component. There may be multiple lamps 35 and multiple lamps per microphone, depending on the implementation. The lamps may be coupled to the main processor 4, a user interface controller 14, 20 or to any other suitable controller. The microphones and lamps may be placed in a separate housing together with other selected components such as speakers, cameras, inertial sensors and other devices that is connected by wires or wirelessly with the other components of the computing system. The separate components may be in the form of a wearable device or a portable device.

The computing device may be fixed, portable, or wearable. In further implementations, the computing device 100 may be any other electronic device that processes data or records data for processing elsewhere. In various implementations, the computing device 100 may be a laptop, a netbook, a notebook, an ultrabook, a smartphone, a tablet, a personal digital assistant (PDA), an ultra mobile PC, a mobile phone, a desktop computer, a server, a set-top box, an entertainment control unit, a digital camera, a portable music player, or a digital video recorder.

Embodiments may be implemented using one or more memory chips, controllers, CPUs (Central Processing Unit), microchips or integrated circuits interconnected using a motherboard, an application specific integrated circuit (ASIC), and/or a field programmable gate array (FPGA).

References to "one embodiment", "an embodiment", "example embodiment", "various embodiments", etc., indicate that the embodiment(s) so described may include particular features, structures, or characteristics, but not every embodiment necessarily includes the particular features, structures, or characteristics. Further, some embodiments may have some, all, or none of the features described for other embodiments.

In the following description and claims, the term "coupled" along with its derivatives, may be used. "Coupled" is used to indicate that two or more elements co-operate or interact with each other, but they may or may not have intervening physical or electrical components between them.

As used in the claims, unless otherwise specified, the use of the ordinal adjectives "first", "second", "third", etc., to describe a common element, merely indicate that different instances of like elements are being referred to, and are not intended to imply that the elements so described must be in a given sequence, either temporally, spatially, in ranking, or in any other manner.

The drawings and the forgoing description give examples of embodiments. Those skilled in the art will appreciate that one or more of the described elements may well be combined into a single functional element. Alternatively, certain elements may be split into multiple functional elements. Elements from one embodiment may be added to another embodiment. For example, orders of processes described herein may be changed and are not limited to the manner described herein. Moreover, the actions of any flow diagram need not be implemented in the order shown; nor do all of the acts necessarily need to be performed. Also, those acts that are not dependent on other acts may be performed in parallel with the other acts. The scope of embodiments is by no means limited by these specific examples. Numerous variations, whether explicitly given in the specification or not, such as differences in structure, dimension, and use of material, are possible. The scope of embodiments is at least as broad as given by the following claims.

The following examples pertain to further embodiments. The various features of the different embodiments may be variously combined with some features included and others excluded to suit a variety of different applications. Some embodiments pertain to an apparatus that includes an external housing, an acoustic port through a surface of the external housing, an acoustic transducer, a tube between the port and the acoustic transducer having a channel to conduct audio from the port to the acoustic transducer, and a lamp to illuminate the channel so that the channel conducts light out the port.

In further embodiments the tube is transparent so that light from the lamp enters the channel through the tube.

In further embodiments the tube is formed from one of glass or plastic.

Further embodiments include a circuit board, wherein the acoustic transducer and the lamp are mounted to the circuit board.

In further embodiments the lamp comprises a light emitting diode.

In further embodiments the surface is a front cover of the housing, the apparatus further comprising a rear cover of the housing opposite the front cover and wherein the port is through the front cover and the acoustic transducer is attached to an inside of the rear cover.

Further embodiments include a resilient seal between the tube and the acoustic transducer to acoustically seal the acoustic transducer to the tube.

Further embodiments include a resilient seal between the tube and the surface of the external housing to acoustically seal the tube to the external housing.

Further embodiments include a second lamp to illuminate the channel so that the channel conducts light of the second lamp out the port, the second lamp producing a different color light than the first lamp.

Further embodiments include a reflector near the lamp to reflect the illumination from the lamp toward the channel.

Further embodiments include a diffuser between the lamp and the channel to diffuse light entering the channel from the lamp.

In further embodiments the diffuser comprises a texture applied to the tube.

Further embodiments include an acoustic screen over the port, the screen diffusing light conducted out the port.

In further embodiments the acoustic transducer is a microphone.

Some embodiments pertain to an illuminated microphone port that includes a port through a housing, a microphone within the housing, a tube connected at one end to the microphone and at another end to the port, the tube having a channel to conduct audio from the port to the microphone, and a lamp within the housing optically coupled to the channel.

In further embodiments the tube is formed of a clear acrylic with a diffusing surface.

Further embodiments include a printed circuit board and wherein the lamp and the microphone are coupled to the printed circuit board, Some embodiments pertain to a smartphone that includes an external housing having a front surface, an acoustic port through the front surface of the external housing, a lamp, a microphone, a processor coupled to the lamp to control illumination generated by the lamp, and a tube between the port and the microphone having a channel to conduct audio from the port to the microphone, wherein the lamp illuminates the channel so that the channel conducts light out the port.

In further embodiments the tube is rigid, the apparatus further comprising a resilient seal between the tube and the microphone to acoustically seal the microphone to the tube.

In further embodiments the tube is rigid, the apparatus further comprising a resilient seal between the tube and the surface of the external housing to acoustically seal the tube to the external housing.

What is claimed is:

1. An apparatus comprising:
    an external housing;
    an acoustic port through a surface of the external housing;
    an acoustic transducer;
    a tube between the port and the acoustic transducer having a channel to conduct audio from the port to the acoustic transducer;
    a lamp to illuminate the channel so that the channel conducts light out the port;
    one or both of (i) a reflector near the lamp to reflect the illumination from the lamp toward the channel and/or (ii) a diffuser between the lamp and the channel to diffuse light entering the channel from the lamp; and
    a circuit board, wherein the acoustic transducer and the lamp are mounted on a same side of the circuit board.

2. The apparatus of claim 1, wherein the tube is transparent so that light from the lamp enters the channel through the tube.

3. The apparatus of claim 1, wherein the tube is formed from one of glass or plastic.

4. The apparatus of claim 1, wherein the lamp comprises a light emitting diode.

5. The apparatus of claim 1, wherein the surface is a front cover of the housing, the apparatus further comprising a rear cover of the housing opposite the front cover and wherein the port is through the front cover and the acoustic transducer is attached to an inside of the rear cover.

6. The apparatus of claim 1, further comprising a resilient seal between the tube and the acoustic transducer to acoustically seal the acoustic transducer to the tube.

7. The apparatus of claim 1, further comprising a resilient seal between the tube and the surface of the external housing to acoustically seal the tube to the external housing.

8. The apparatus of claim 1, further comprising a second lamp to illuminate the channel so that the channel conducts light of the second lamp out the port, the second lamp producing a different color light than the first lamp.

9. The apparatus of claim 1, wherein the apparatus includes the reflector near the lamp to reflect illumination from the lamp toward the channel.

10. The apparatus of claim 1, wherein the apparatus includes the diffuser between the lamp and the channel to diffuse light entering the channel from the lamp.

11. The apparatus of claim 10, wherein the diffuser comprises a texture applied to the tube.

12. The apparatus of claim 1, further comprising an acoustic screen over the port, the screen diffusing light conducted out the port.

13. The apparatus of claim 1, wherein the acoustic transducer is a microphone.

14. The apparatus of claim 1, wherein the surface is a front cover of the housing, and the lamp is attached to an inside of the front cover.

15. An illuminated microphone port comprising:
    a port through a housing;
    a microphone within the housing;
    a tube connected at one end to the microphone and at another end to the port, the tube having a channel to conduct audio from the port to the microphone, wherein the tube includes a diffusing surface, wherein the tube is formed of a clear plastic or glass; and
    a lamp within the housing optically coupled to the channel.

16. The port of claim 15, further comprising a printed circuit board and wherein the lamp and the microphone are coupled to the printed circuit board.

17. An apparatus comprising:
    an external housing having (i) a first surface and (ii) a second surface that is opposite the first surface;
    an acoustic port through the first surface of the external housing;
    a lamp;
    a microphone mounted on the second surface;
    a processor coupled to the lamp to control illumination generated by the lamp; and
    a tube between the port and the microphone having a channel to conduct audio from the port to the microphone, wherein the lamp illuminates the channel so that the channel conducts light out the port.

18. The apparatus of claim 17, wherein the tube is rigid, the apparatus further comprising a first resilient seal between the tube and the microphone to acoustically seal the microphone to the tube, and/or a second resilient seal between the tube and the surface of the external housing to acoustically seal the tube to the external housing.

* * * * *